(12) United States Patent
Oyama et al.

(10) Patent No.: US 6,563,530 B1
(45) Date of Patent: May 13, 2003

(54) CAMERA POSITION-CORRECTING METHOD AND SYSTEM AND DUMMY COMPONENT FOR USE IN CAMERA POSITION CORRECTION

(75) Inventors: Kazuyoshi Oyama, Tochigi-ken (JP); Masayuki Mohara, Gunma-ken (JP)

(73) Assignee: Sanyo Electric Co., Ltd., Osaka-Fu (JP)

( * ) Notice: Subject to any disclaimer, the term of this patent is extended or adjusted under 35 U.S.C. 154(b) by 0 days.

(21) Appl. No.: 09/237,177

(22) Filed: Jan. 25, 1999

(30) Foreign Application Priority Data

Jan. 27, 1998 (JP) .......................................... 10-029339

(51) Int. Cl.[7] ................................................ H04N 7/18
(52) U.S. Cl. ........................................ 348/87; 348/95
(58) Field of Search ............................. 348/87, 94, 95, 348/126, 141; 29/740; H04N 7/18

(56) References Cited

U.S. PATENT DOCUMENTS 5,189,707 A * 2/1993 Suzuki et al. ................ 348/87
6,154,954 A * 12/2000 Seto et al. .................... 29/740
6,199,272 B1 * 3/2001 Seto et al. .................... 29/740

* cited by examiner

Primary Examiner—Young Lee

(57) ABSTRACT

There are provided a method and device for correcting a camera position, and a dummy component for use in camera position correction. A board-sensing camera for sensing a position of a circuit board is caused to take an image of a dummy component in an attitude-fixed state in a first coordinate system peculiar to a board-sensing camera. A component-sensing camera for sensing a position of an electronic component to be mounted on the circuit board is caused to take an image of the dummy component in an attitude-fixed state in a second coordinate system peculiar to a component-sensing camera. An amount of deviation of a center of the dummy component from a sensing center of the board-sensing camera and an amount of deviation of the center of the dummy component from a sensing center of the component-sensing camera are calculated from results of the taking of the image of the dummy component by the board-sensing camera and results of the taking of the image of the dummy component by the component-sensing camera. At least one of the first coordinate system and the second coordinate system is corrected based on the calculated amounts of deviation of the center of the dummy component.

13 Claims, 7 Drawing Sheets

F I G. 5
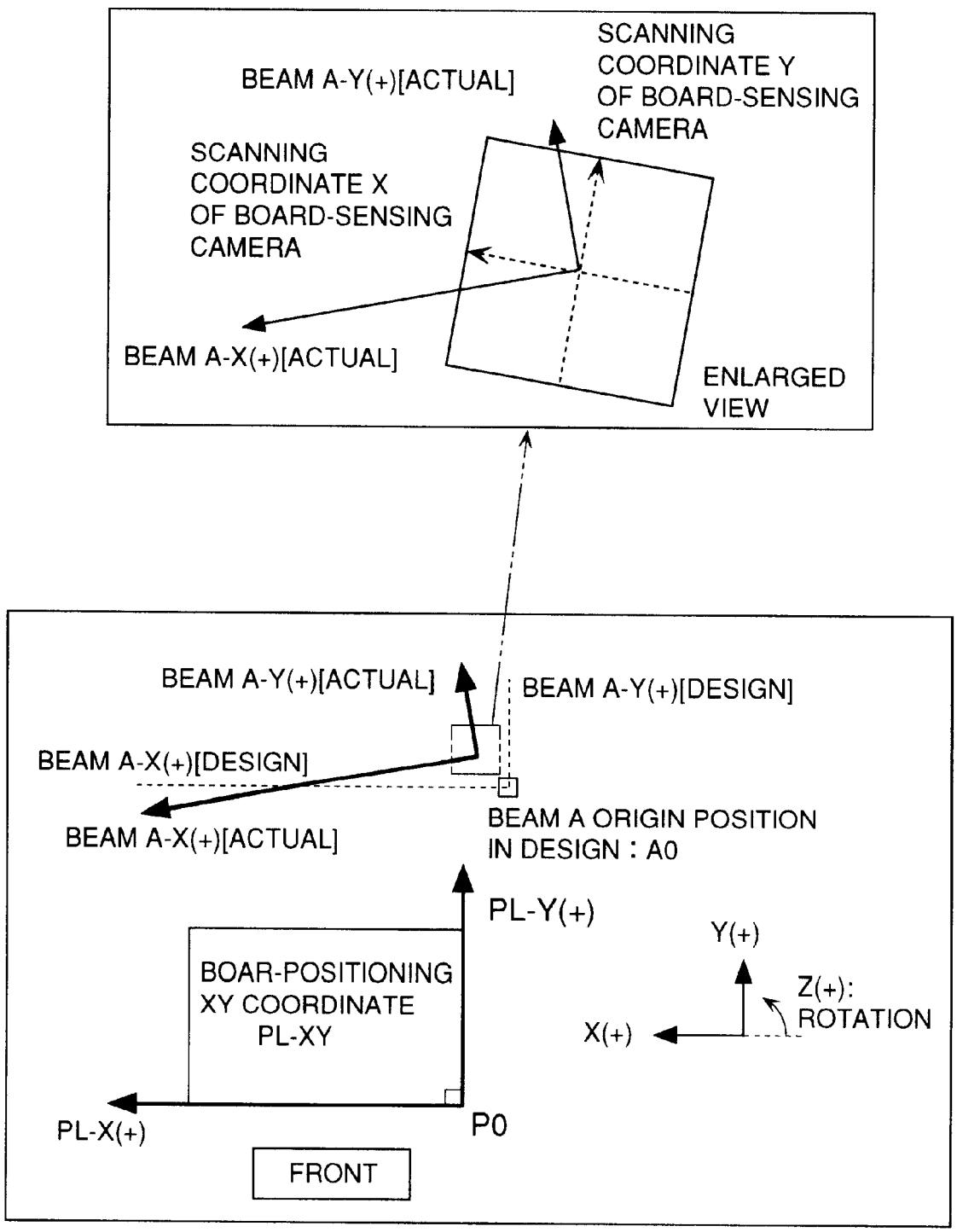

CAMERA POSITION-CORRECTING METHOD AND SYSTEM AND DUMMY COMPONENT FOR USE IN CAMERA POSITION CORRECTION

BACKGROUND OF THE INVENTION

1. Field of the Invention

This invention relates to a camera position-correcting method and system for compensating for displacement between the coordinate system of a component-sensing camera and that of a board-sensing camera used e.g. in an electronic component-mounting apparatus, as well as a dummy component for use in correction of camera positions.

2. Prior Art

Conventionally, in an electronic component-mounting apparatus, a board-sensing camera installed therein takes an image of a mark on a circuit board introduced into a main part of the apparatus, thereby sensing a position of the circuit board, while a component-sensing camera also installed in the apparatus takes an image of an electronic component to be mounted on the circuit board, thereby sensing a position of the electronic component. The electronic component is mounted on the circuit board after the position of the component is corrected, based on results of the sensing of the position of the circuit board and that of the component. In this case, however, unless coordinate systems of the two cameras quite agree with each other in both X and Y-directions as well as angle θ (hereinafter, "θ" is represented as "z"), the electronic component cannot be mounted accurately on the circuit board even if the correction of the position of the component is carried out.

For this reason, in the conventional electronic component-mounting apparatus, a displacement between the coordinate system of the component-sensing camera and that of the board-sensing camera is compensated for when the apparatus is installed, or periodically (e.g. when the apparatus is in operation) in view of changes in temperature or the like. More specifically, after a real electronic component is mounted on a dummy board introduced into the main part of the apparatus, following the steps described above, the amount of deviation between a design mounting position on the dummy board and an actual mounting position on the same is measured by the use of a measuring device additionally provided, and then a result of the measurement is inputted into the electronic component-mounting apparatus, whereby the displacement between the coordinate system of the component-sensing camera and that of the board-sensing camera is compensated for (displacements of the respective coordinate systems of the two cameras with respect to an absolute reference coordinate system of the apparatus body are also compensated for at the same time).

As described above, in the conventional electronic component-mounting apparatus, the measuring device is needed for correction of the coordinate systems of the two cameras, and at the same time, correction operations including the transfer of the dummy board and the measurement are troublesome and time-consuming. In addition, since a real electronic component is used for the correction, it is required to consider manufacturing tolerances of the electronic component, and hence the mounting and measurement described above is required to be carried out a plurality of times by using a plurality of electronic components, to thereby obtain an average value of the amounts of deviation.

SUMMARY OF THE INVENTION

It is a first object of the invention to provide a camera position-correcting method and device which makes it possible to accurately compensate for a displacement between a coordinate system peculiar to a component-sensing camera and a coordinate system peculiar to a board-sensing camera, with ease and rapidity.

It is a second object of the invention to provide a dummy component for use in accurately compensating for a displacement between a coordinate system peculiar to a component-sensing camera and a coordinate system peculiar to a board-sensing camera, with ease and rapidity.

To attain the first object, according to a first aspect of the invention, there is provided a method of correcting a camera position by compensating for a displacement between a first coordinate system peculiar to a board-sensing camera for sensing a position of a circuit board, and a second coordinate system peculiar to a component-sensing camera for sensing a position of an electronic component to be mounted on the circuit board.

This method is characterized by comprising the steps of:

causing the board-sensing camera to take an image of a dummy component in an attitude-fixed state in the first coordinate system;

causing the component-sensing camera to take an image of the dummy component in an attitude-fixed state in the second coordinate system;

calculating an amount of deviation of a center of the dummy component from a sensing center of the board-sensing camera and an amount of deviation of the center of the dummy component from a sensing center of the component-sensing camera, from a result of the taking of the image of the dummy component by the board-sensing camera and a result of the taking of the image of the dummy component by the component-sensing camera; and correcting at least one of the first coordinate system and the second coordinate system based on the calculated amounts of deviation of the center of the dummy component.

According to this method, in the first place, by taking images of the dummy component by the board-sensing camera and the component-sensing camera in the first and second coordinate systems peculiar to the respective cameras, amounts of deviation of the sensing centers of the cameras from the center of the component sensed in the coordinate systems peculiar to the respective cameras are sensed. The taking of the images is carried out with the dummy component in the respective attitude-fixed states, and hence the two cameras each sense the dummy component in basically identical conditions. As a result, a total sum of deviations of the sensing center of the board-sensing camera and the sensing center of the component-sensing camera from the center of the dummy component form a displacement between the two cameras. Correction of the first coordinate system peculiar to the board-sensing camera and/or the second coordinate system peculiar to the component-sensing camera based on the deviations makes the two coordinate systems agree with each other. That is, the displacement between the two existing coordinate systems caused by the deviations of at least one of the coordinate systems from its or their design coordinate systems can be compensated for through the sensing of the dummy component by the respective cameras. It should be noted that although a real electronic component may be used as the dummy component, the use of a dedicated one made for this purpose is preferred from the viewpoint of accuracy.

To attain the first object, according to a second aspect of the invention, there is provided a camera position-correcting system, comprising:

a dummy component;

a board-sensing camera normally used for taking an image of a circuit board, the board-sensing camera having a first coordinate system peculiar thereto;

a component-sensing camera normally used for taking an image of an electronic component to be mounted on the circuit board, the component-sensing camera having a second coordinate system peculiar thereto;

image-taking operation control means for causing the board-sensing camera to take an image of the dummy component in an attitude-fixed state in the first coordinate system and the component-sensing camera to take an image of the dummy component in an attitude-fixed state in the second coordinate system;

deviation-calculating means for calculating an amount of deviation of a center of the dummy component form a sensing center of the board-sensing camera and an amount of deviation of the center of the dummy component from a sensing center of the component-sensing camera, from a result of the taking of the image of the dummy component by the board-sensing camera and a result of the taking of the image of the dummy component by the component-sensing camera; and correction means for correcting at least one of the first coordinate system and the second coordinate system based on the calculated amounts of deviation of the center of the dummy component to thereby compensate for a displacement between the first coordinate system and the second coordinate system.

According to this camera position-correcting system, first, the image-taking operation control means controls the board-sensing camera and the component-sensing cameras such that they take images of the dummy component in the first and second coordinate systems peculiar to the respective cameras. Then, amounts of deviation of the sensing centers of the cameras from the center of the component sensed in the coordinate systems peculiar to the respective cameras are recognized or calculated based on the results of the image-taking operations by the deviation-calculating means. The correction means corrects the coordinate systems peculiar to the respective cameras based on the amounts of deviations thus recognized. The taking of the images is carried out with the dummy component in the respective attitude-fixed states, and hence the two cameras each sense the dummy component in basically identical conditions. As a result, a total sum of the amounts of deviations of the sensing center of the board-sensing camera and the sensing center of the component-sensing camera from the center of the dummy component form a displacement between the first and second coordinate systems peculiar to the respective cameras. Correction of the first coordinate system peculiar to the board-sensing camera and/or the second coordinate system peculiar to the component-sensing camera based on the amounts of deviation makes the two coordinate systems agree with each other. That is, the displacement between the two existing coordinate systems caused by the deviations of at least one of the coordinate systems from its or their design coordinate systems can be compensated for through the sensing of the dummy component by the respective cameras.

Preferably, the first coordinate system and the second coordinate system each include an angle of rotation on a horizontal plane.

According to this preferred embodiment, it is possible to compensate for the deviations resulting from errors in mounting angle of the board-sensing camera and the component-sensing cameras within respective horizontal planes, and this makes it possible to mount electronic components on circuit boards with higher accuracy.

Preferably, the camera position-correcting system includes a body, and the component-sensing camera is fixedly arranged in the body based on an absolute reference coordinate system peculiar to the body, and the board-sensing camera is movably arranged in the body based on the absolute reference coordinate system, the camera position-correcting system further comprising a dummy board for being positioned on the body based on the absolute reference coordinate system, and absolute correction means for compensating for a displacement between the first coordinate system and the absolute reference coordinate system, via the dummy board placed on the body, prior to compensating for the displacement between the first coordinate system and the second coordinate system.

According to this preferred embodiment, the absolute correction means is capable of compensating for a displacement of the first coordinate system peculiar to the board-sensing camera with respect to the absolute reference coordinate system by the sensing of the dummy board. Through correction of the first and second coordinate systems peculiar to the respective cameras, the displacements of the two coordinate systems from the absolute reference coordinate system can be compensated for. In other words, the mounting of electronic components on circuit boards can be accurately carried out based on the absolute reference coordinate system.

Preferably, the first coordinate system, the second coordinate system and the absolute reference coordinate system each include an angle of rotation on a horizontal plane.

According to this preferred embodiment, it is possible to compensate for the deviations of the board-sensing camera and the component-sensing cameras with respect to the absolute reference coordinate system, which result from errors in mounting angle of the two cameras within respective horizontal planes.

More preferably, the camera position-correcting system further includes X-Y motion means for moving the board-sending camera in an X-Y direction, and the absolute correction means compensates for the displacement between the first coordinate system and the absolute reference coordinate system, and at the same time compensates for an angular displacement of a moving coordinate system peculiar to the X-Y motion means with respect to the absolute reference coordinate system, via the dummy board placed on the body.

According to the preferred embodiment, an angular displacement between a moving coordinate system peculiar to the X-Y motion means and the absolute reference coordinate system can be compensated for, whereby an error in motion of the board-sensing camera caused by the X-Y motion means can be compensated for.

More preferably, the camera position-correcting system includes a mounting head for mounting the electronic component on the circuit board, and a support member movably mounted on the body, the board-sensing camera, the mounting head, and the support member forming a unit for motion in unison, the mounting head being fixed to the support member based on the absolute reference coordinate system.

According to this preferred embodiment, the mounting head is fixed to the support member based on the absolute reference coordinate system. Therefore, it is possible to mount electronic parts on circuit boards with higher accuracy.

Preferably, the dummy component comprises a transparent base and an imaging pattern depicted on the base.

According to this preferred embodiment, the imaging pattern for being sensed by the cameras is depicted on the base, and hence it has no thickness. The cameras take images of the pattern without thickness, and pattern recognition can be carried out with higher accuracy than when it is carried out on a real electronic component having a thickness. In short, the accuracy of correction or compensation for the displacement or deviations can be enhanced.

Preferably, the camera position-correcting system includes a dummy component-storing device for storing the dummy component therein, and an image-taking table for placing the dummy component thereon to permit the board-sensing camera to take the image of the dummy component, and the image-taking table has a table on which the dummy component is placed, and a backlight for irradiating the dummy component through the table.

According to this preferred embodiment, the dummy component can be equipped for use at all times. Further, by irradiating the dummy component by the backlight when the board-sensing camera takes the image of the dummy component, the pattern recognition can be carried out with higher accuracy. That is, the accuracy of correction of the coordinate systems or compensation for displacement therebetween can be enhanced.

To attain the second object, according to a third aspect of the invention, there is provided a dummy component for camera position correction, which is used for enabling an amount of deviation of a center thereof from a sensing center of a sensing-camera to be sensed through taking an image of the dummy component.

The dummy component is characterized by comprising:

a transparent base; and an imaging pattern depicted on the transparent base.

According to the dummy component, the imaging pattern for being sensed by the cameras is depicted on the base, and hence it has no thickness. The cameras take images of the pattern without thickness, and pattern recognition can be carried out with higher accuracy than when it is carried out on a real electronic component having a thickness.

Preferably, the imaging pattern is depicted on a lower surface of the base.

According to this preferred embodiment, the imaging pattern can be sensed in the same manner as a real electronic component is sensed by the cameras. This makes it possible to reduce an error in recognition resulting from the difference in image-taking conditions between the an electronic component and the dummy component.

Preferably, the base is formed of glass, and the imaging pattern is formed by vapor-depositing chromium oxide on the base.

According to this preferred embodiment, the imaging pattern having a durability can be accurately depicted on the base made of glass, which makes it possible to sense the accurate pattern with accuracy.

Preferably, the imaging pattern comprises a large number of rectangular pattern elements arranged to generally form a rectangular outline.

According to this preferred embodiment, it is possible not only to recognize the imaging pattern as a whole, and but also to carry out a number of pattern recognitions by using the large number of pattern elements even if the imaging pattern is single. Therefore, by averaging the number of pattern recognition, even higher pattern recognition can be attained.

Preferably, the imaging pattern comprises a plurality of large and small patterns each having an identical center and permitting the sensing of the amount of deviation.

According to this preferred embodiment, when a plurality of cameras which are different in magnification (resolution) are used for pattern recognition, the pattern recognition can be carried out in a manner suitable for the selected resolution.

The above and other objects, features, and advantages of the invention will become more apparent from the following detailed description taken in conjunction with the accompanying drawings.

BRIEF DESCRIPTION OF THE DRAWINGS

FIG. 5 is a diagram schematically showing an example of an X-Y stage having a motion angle deviation and the dummy board set on a board-setting table;

DETAILED DESCRIPTION

Figure 1:
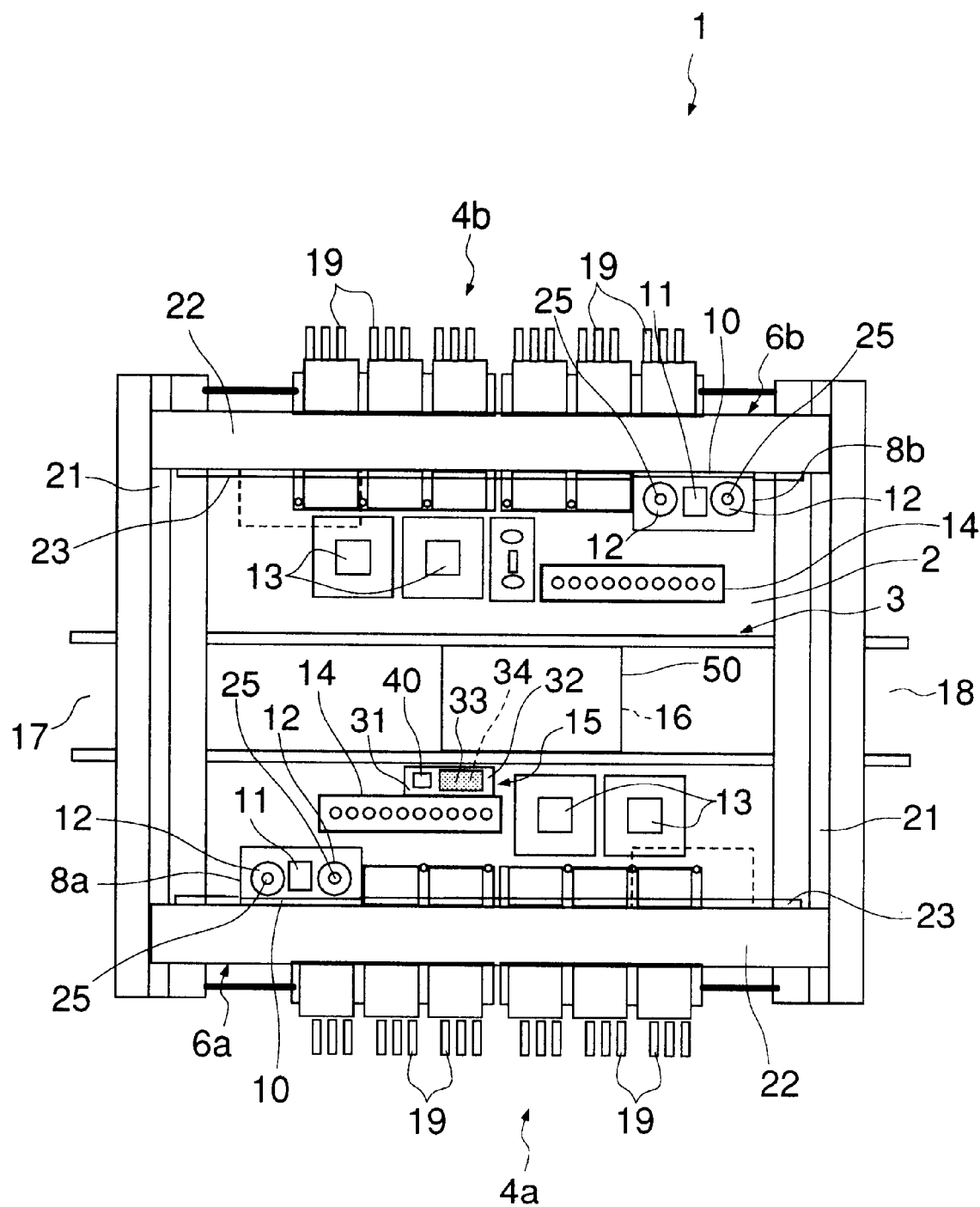
FIG. 1 is a plan view of an electronic component-mounting apparatus to which are applied a camera position-correcting method and system and a dummy component for use in correction of camera positions, according to an embodiment of the invention.

The invention will now be described in detail with reference to drawings showing an embodiment thereof. In the embodiment, a method and system for correcting camera positions and a dummy component for use in correction of camera positions according to the invention are applied to an electronic component-mounting apparatus. The electronic component-mounting apparatus is a so-called multi-function chip mounter used for mounting various kinds of electronic components, such as surface mount components including chip capacitors, chip resistances, etc., and multi-lead components of flat package ICs. FIG. 1 is a plan view of the electronic component-mounting apparatus. As shown in the figure, the electronic component-mounting apparatus 1 is comprised of a base 2, a conveyor 3 extending longitudinally (left-right direction as viewed in the figure) on a central area of the base 2, a first electronic component-feeding block 4a arranged at a front end (lower end as viewed in the figure) of the base 2, a second electronic component-feeding block 4b arranged at a rear end (upper end as viewed in the figure) of the base 2, and first and second X-Y stages 6a, 6b movably arranged at respective front and rear portions of the base 2.

The first X-Y stage 6a has a first head unit 8a installed thereon, and similarly, the second X-Y stage 6b has a second head unit 8b installed thereon, for picking up by vacuum and mounting electronic components. Each of the head units 8a, 8b is each attached to a support member 10 and has a board-sensing camera 11 and two mounting heads 12, 12 mounted thereon. Further, two pairs of component-sensing cameras 13, 13, 13, 13 and two nozzle storage devices 14, 14 are also arranged on the base 2 at locations on respective transversely opposite sides of the conveyer 3. The component-sensing cameras 13, 13 and the nozzle storage device 14 arranged in the front part of the base 2 correspond to the first head unit 8a, while the component-sensing cameras 13, 13 and the nozzle storage device 14 arranged in the rear part of the base 2 correspond to the second head unit 8b. Further, in the immediate vicinity of the nozzle storage device 14 in the front part of the base 2, there is arranged a jig unit 15 for storing a dummy component 40, referred to hereinafter.

The electronic component-mounting apparatus 1 is supplied with electronic components, which are small in size, such as surface mount components, at the first and second component-feeding blocks 4a, 4b, and electronic components, which are large in size, such as multi-lead components, at a component-feeding block of a tray type, not shown. Circuit boards are each supplied by the conveyor 3 from a left side as viewed in the figure, fixedly set at a center of the base 2, and then delivered rightward. For example, when the first X-Y stage 6a is operated to mount an electronic component, the first head unit 8a thereon is brought to the first component-feeding block 4a (or another component-feeding block), from which a desired electronic component is picked up by vacuum, and then the electronic component is brought to the component-sensing cameras 13 and sensed by the same for position recognition. Further, the first head unit 8a is moved to a predetermined position above a circuit board, from which the electronic component is mounted on the circuit board after the position of the circuit board is sensed by the board-sensing camera 11. Before the mounting of the electronic component, correction of the position of the picked electronic component with respect to the mounting head 8a is carried out based on results of the sensing by the component-sensing camera 13, and correction of the position of the nozzle of the mounting head with respect to a mounting position on the circuit board at which the picked electronic component is to be mounted is carried out based on results of the sensing by the board-sensing camera 11. Normally, the first X-Y stage 6a and the second X-Y stage 6b are alternately operated.

The conveyor 3 includes a board-setting table 16 located in the center thereof, a supply passage 17 located on the left side thereof, and a delivery passage 18 located on the right side thereof, as viewed in the figure. Each circuit board is supplied to the table 16 via the supply passage 17, and set at a predetermined location on the table 16 at a predetermined level to have electronic components mounted thereon. The circuit board having the electronic components mounted thereon is delivered via the delivery passage 18. During this process, a new circuit board to be supplied, not shown, is on standby in the supply passage 17, and the immediately preceding one having the electronic components mounted thereon, not shown, is on standby for delivery in the delivery passage 18. Thus, the circuit boards are conveyed one after another. The board-setting table 16 has a stopper, not shown, formed thereon, which an extreme forward end of a circuit board abuts, and a corner of the stopper is the origin of an absolute reference coordinate system peculiar to the whole apparatus, which will be described in more detail hereinafter.

On the first and second component-feeding blocks 4a, 4b, there are arranged a lot of tape cassettes 19 in parallel with each other. Each tape cassette 19 contains a carrier tape, not shown, which carries electronic components thereon. The electronic components are fed one by one from a forward end of each of the component-feeding blocks 4a, 4b. In a normal operation, when the first head unit 8a is mounting electronic components, replacement of tape cassettes 19 is carried out at the second component -feeding block 4b, while when the second head unit 8b is mounting electronic components, replacement of tape cassettes 19 is carried out at the first component-feeding block 4a.

The first and second X-Y stages 6a, 6b have respective Y-direction movable beams 22, 22, each guided along a pair of Y-axis guide rails 21, 21 arranged at respective right and left ends of the base 2 and extending in a front-rear direction (Y-axis direction). The Y-direction movable beam 22 of the first X-Y stage 6a is moved in the Y-axis direction (front-rear direction) by a left-side ball screw, not shown, and a Y motor 102 (see FIG. 4) for driving the ball screw for rotation. Similarly, the Y-direction movable beam 22 of the second X-Y stage 6b is moved in the Y-axis direction by a right-side ball screw, not shown, and a Y motor 102 (see FIG. 4) for driving the ball screw for rotation.

The two Y-direction movable beams 22, 22 have an identical construction, and each of them contains an X-axis guide rail 23 for guiding the head unit 8a (8b) driven by a driving system to move along the X-axis guide rail 23 in the X-axis direction (left-right direction as viewed in the figure). The driving system is comprised of a ball screw, not shown, and an X motor 101 (see FIG. 4), similarly to the driving systems for moving the respective Y-direction movable beams 22, 22. Thus, the head units 8a, 8b are movable both in the X-axis direction and the Y-axis direction, i.e. on the horizontal plane.

The head units 8a, 8b each include the support member 10 mounted on the X-direction movable beam 22 and moved in the X-axis direction along the Y-direction movable beam 22, the two mounting heads 12, 12 mounted on the support member 10, and the board-sensing camera 11 arranged between the two mounting heads 12, 12. The board-sensing camera 11 senses a reference mark on each circuit board, and a position of the reference mark on a circuit board sensed by the camera 11 serves as a reference position with reference to which each electronic component is mounted on the circuit board. At the bottom of each of the mounting heads 12, there is removably mounted a vacuum nozzle 25 connected to a vacuum device, not shown. The mounting heads 12 each have a Z motor 103 (see FIG. 4) installed therein for rotating an electronic component on the horizontal plane via the vacuum nozzle 25.

The jig unit 15 is comprised of a dummy component-storing device 31 for storing the dummy component 40 and an image-taking table 32 on which the dummy component 40 is placed to have its image taken. The dummy component-storing device 31 has a surface thereof formed with a shallow groove in which the dummy component is fitted for storage. The image-taking table 32 includes an image-taking plated 33 permitting diffuse transmission of light and a backlight 34 comprised of an LED array, etc. arranged under the image-taking plate 33. In the case of sensing the dummy component 40 by the board-sensing camera 11, which will be described in more detail hereinafter, the dummy component 40 placed on the image-taking plated 33 is illuminated by the backlight 34, and an image thereof is taken from above.

The dummy component 40 and the jig unit 15 are used for compensating for a displacement between the coordinate system of the board-sensing camera 11 for sensing a position of a circuit board and that of the component-sensing camera 13 for sensing a position of an electronic component. The compensation is performed by causing the board-sensing camera 11 and the component-sensing camera 13 to take images of the dummy component 40 moved thereto on the mounting head 12 for recognition thereof. Prior to the compensation for the displacement between the coordinate systems peculiar to the respective two cameras 11, 13, a dummy board 50 is introduced onto the board-setting table 16, and a predetermined portion of the dummy board 50 is sensed by the board-sensing camera 11, whereby displacement of the coordinate system of the board-sensing camera 11 with respect to the absolute reference coordinate system peculiar to the base 2 is compensated for.

Figure 2:
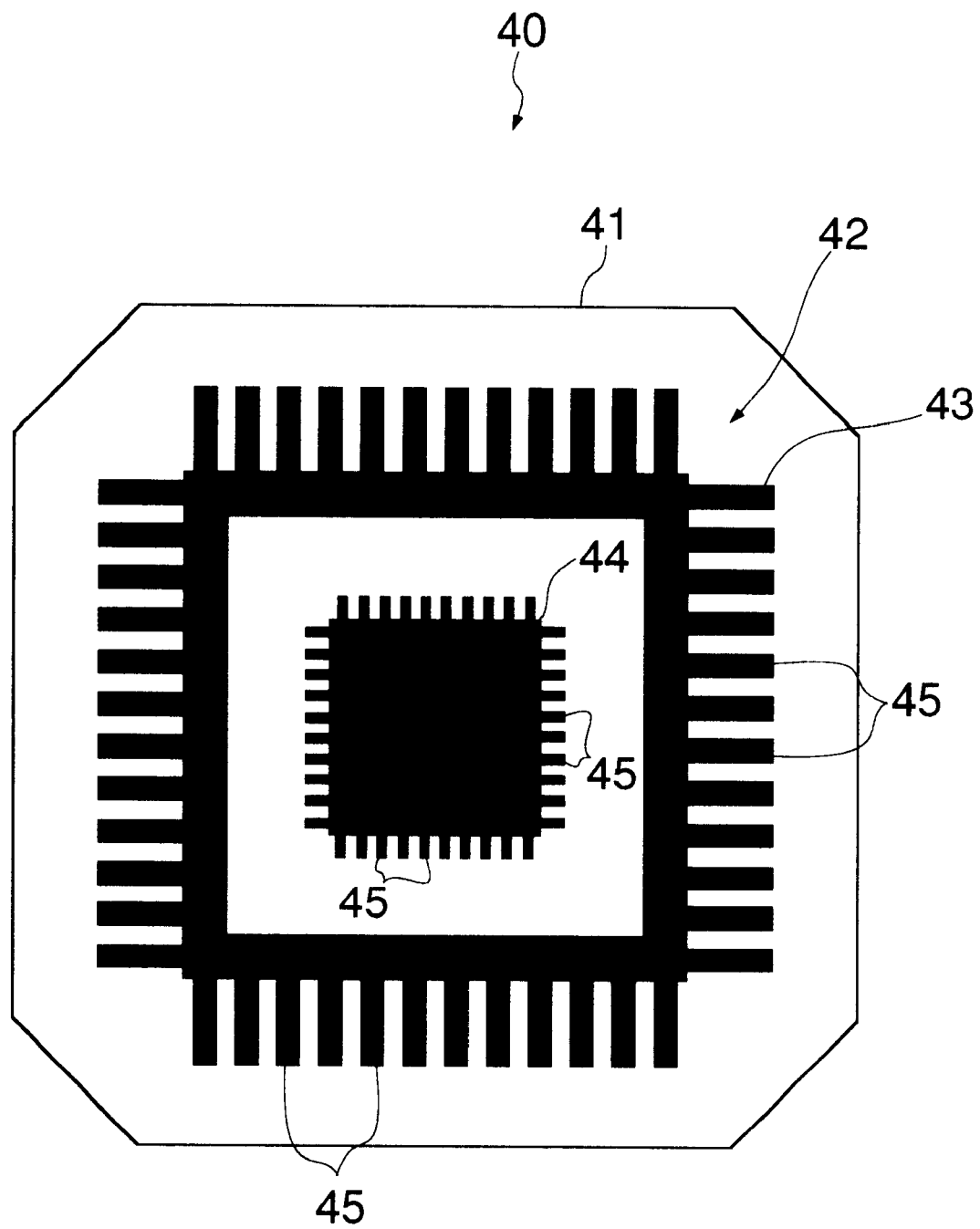
FIG. 2 is a plan view of the dummy component used in the camera position-correcting method according to the embodiment.

As shown in FIG. 2, the dummy component 40 is comprised of a square base 41 having four corners thereof chamfered and an imaging pattern 42 depicted on a reverse surface of the base 42. The base 41 is formed of glass having a thickness of 1 to 2 mm so as to maintain rigidity. The imaging pattern 42 is formed by vapor-depositing chromium oxide on the base 42. The pattern 42 includes a large pattern 43 and a small pattern 44 which is depicted in an area enclosed by the large pattern 43, both of which have an identical center. The large and small patterns 43, 44, each resembles a lead component in shape, with numerous rectangular pattern elements 45, each analogous to a lead, arranged along an outer periphery thereof at equal space intervals to generally form a square outline.

This kind of electronic component-mounting apparatus 1 is capable of changing the magnification of the component-sensing camera 13 depending on the type of an electronic component to be mounted. For example, when a multi-lead electronic component is to be mounted, the magnification of the component-sensing camera 13 is increased so as to enhance resolution of the camera 13. In this case, the small pattern 44 is brought into focus as an object in a state of the imaging pattern 42 being properly put within a field of view of the camera 13. On the other hand, when the magnification of the camera 13 is decreased, the large pattern 43 is brought into focus as an object to be sensed. Thus, it is possible to sense a pattern in accordance with the resolution of the camera 11 or 13. Further, since each of the patterns 43, 44 is formed with the pattern elements 45 arranged side by side, it is possible to carry out a plurality of pattern recognitions by using each pattern element 45 when the single pattern 43 or 44 is used. The averaging of a plurality of results of the sensing enables more accurate pattern recognition. The dummy component 40 is stored with the imaging pattern 42 facing downward, and picked up and sensed in this attitude-fixed state.

Figure 3:
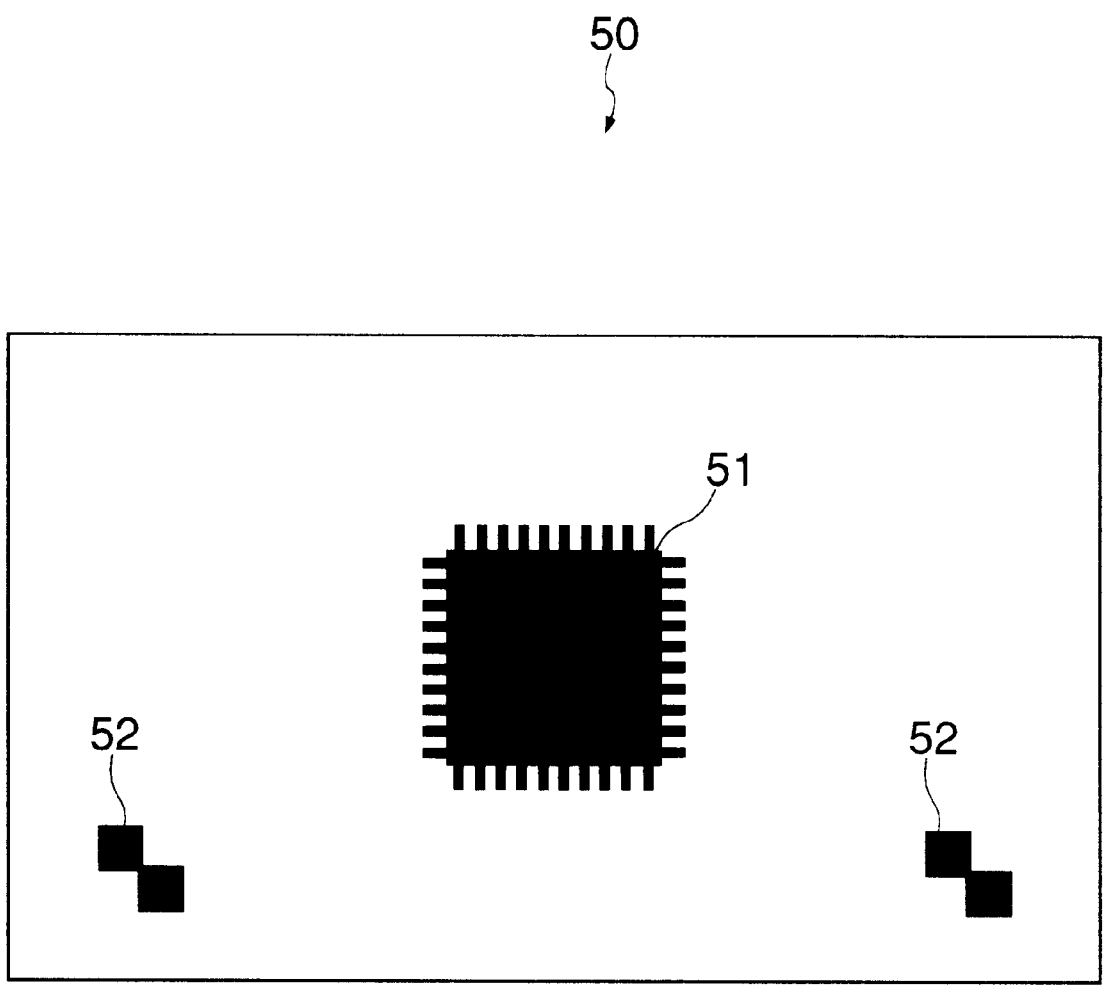
FIG. 3 is a plan view of a dummy board used in the camera position-correcting method according to the embodiment.

The dummy board 50 has a rectangular shape, as shown in FIG. 3, and is formed to have an average size of circuit boards. At a center of a front surface of the dummy board 50, there is depicted a recognition pattern 51 which is identical in shape to the above-mentioned small pattern 44, and in lower right and left corners of the front surface as viewed in the figure, a pair of recognition marks 52, 52 are depicted, respectively, longitudinally apart from each other. A forward end of the dummy board 50 in the direction of conveying thereof, which is introduced onto the board-setting table 16, abuts the stopper, not shown, of the table 16, whereby the dummy board 50 is set in the absolute reference coordinate system peculiar to the base 2. Therefore, the sensing of the recognition pattern 51 by the board-sensing camera 11 makes it possible to compensate for a displacement of the coordinate system of the camera 11 with respect to the absolute reference coordinate system of the base 2. Further, the sensing of the pair of recognition marks 52, 52 makes it possible to compensate for a displacement of the coordinate system of each camera 11 with respect to the absolute reference coordinate system due to a deviation in the angle of motion of each of the X-Y stages 6a, 6b.

Figure 4:
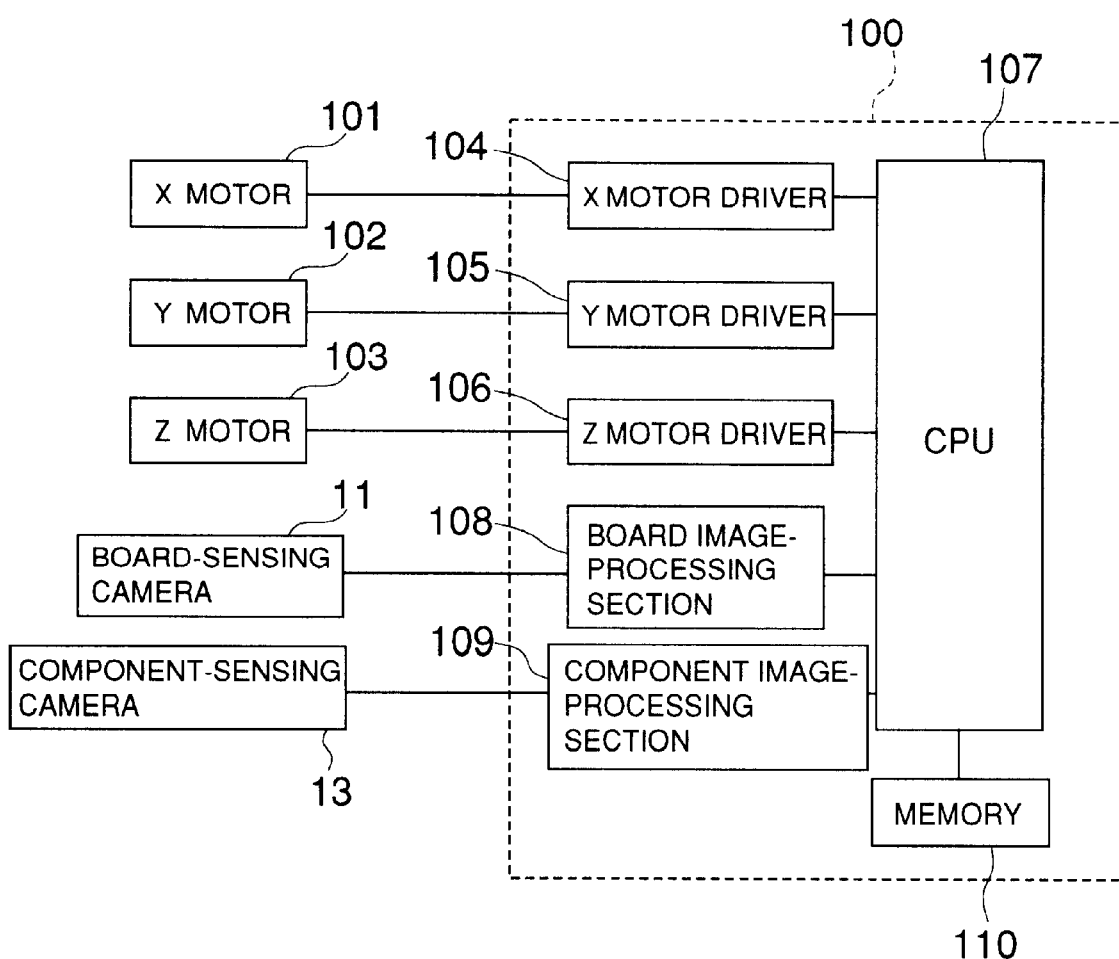
FIG. 4 is a block diagram schematically showing a control system of the FIG. 1 electronic component-mounting apparatus.

Next, a control system 100 of the electronic component-mounting apparatus 1 will be described briefly with reference to FIG. 4, prior to description of the camera position-correcting method using the dummy component 40 and the dummy board 50. It should be noted that the following description will be made of the first X-Y stage 6a side alone. As shown in the figure, the control system 100 is connected to the X motor 101 and the Y motor 102 for moving the head unit 8a via the X-Y stage 6a in the X and Y directions, respectively, and the Z motor 103 installed in the mounting head 12 for driving the mounting head for rotation. The X motor 101, the Y motor 102, and the Z motor 103 are connected respectively via an X motor driver 104, a Y motor driver 105, and a Z motor driver 106 to a CPU 107 of the control system 100 to have operations thereof controlled by the CPU 107. Similarly, the board-sensing camera 11 and the component-sensing camera 13 are connected to the CPU 107 via a board image-processing section 108 and a component image-processing section 109, respectively. The backlight 34, not shown in FIG. 4, is also connected to the CPU 107 via a driver.

Further, the CPU 107 has a memory 110 connected thereto for storing various kinds of data including design value data for controlling the motors 104, 105, 106 and the cameras 11, 13 as well as offset data, referred to hereinafter. The offset data is updated through operations for calculating amounts of deviation, described hereinafter, and the CPU 107 corrects the design value data based on the offset data, thereby controlling the motors 104, 105, 106 and the cameras 11, 13. An object sensed by each of the cameras (CCD camera) 11, 13 is recognized by processing including binarization of results of the sensing, which is carried out by a corresponding one of the image processing sections 108, 109, and arithmetic operations on the processed results by the CPU 107.

Next, description will be made of the camera position-correcting method of correcting the position of the board-sensing camera 11 and that of the component-sensing camera 13. First, in the method, a displacement of the coordinate system of the board-sensing camera 11 with respect to the absolute reference coordinate system as well as a deviation in the angle of motion of a moving coordinate system which is peculiar to the Y-direction movable beam 22 and moved therealong, with respect to the absolute reference coordinate system is compensated for by the use of the dummy board 50 shown in FIG. 3. Thereafter, a displacement of the coordinate system of the component-sensing camera 13 from that of the board-sensing camera 11 is compensated for by the use of the dummy component 40 shown in FIG. 2.

In correction of the coordinate system of the board-sensing camera 11 with respect to the absolute reference coordinate system, if there is no deviation in the angle of motion of the X-Y stage 6a by its own motion, it is possible to carry out the correction easily, based on the amount of deviation (offset data) between design values and results of recognition of the recognition pattern 51 of the dummy board 50 sensed by the board-sensing camera 11 by the CPU 107. Therefore, in this embodiment, the description will be restricted to correction carried out by taking a displacement of the X-Y stage 6a with respect to the absolute reference coordinate system caused by a deviation in the angle of motion of the Y-direction movable beam 22, i.e. a displacement of the moving coordinate system peculiar to the Y-direction movable beam 22 from the absolute reference coordinate system. In an actual correction of the coordinate system, a position of the center of the vacuum nozzle 25 is also corrected. However, this correction can be carried out simply by sensing the vacuum nozzle 25 mounted on the mounting head 12, from below by the use of the component-sensing camera 13, so that description of the correction will also be omitted.

FIG. 5 schematically shows the X-Y stage 6a having a deviation in the angle of motion along the Y-direction movable beam 22 and the dummy board 50 set on the board-setting table 16. The dummy board 50 is positioned accurately in the absolute reference coordinate system (board-positioning coordinate system). In the present embodiment, offset data for compensating for a displacement in position and a deviation in the angle of motion of the moving X-Y coordinate system (BeamA-XY) peculiar to the Y-direction movable beam 22 from the design dimensions thereof measured in the circuit board-positioning X-Y coordinates (PL-XY: origin P0) are obtained, and then correction is carried out with respect to the PL-XY coordinate system, based on the obtained offset data. A center of a scanning coordinate system of the board-sensing camera 11 installed on the Y-direction movable beam 22 (or the head unit 8a) agrees with an origin of the moving X-Y coordinate system which is moved along the Y-direction movable beam 22.

Figure 6:
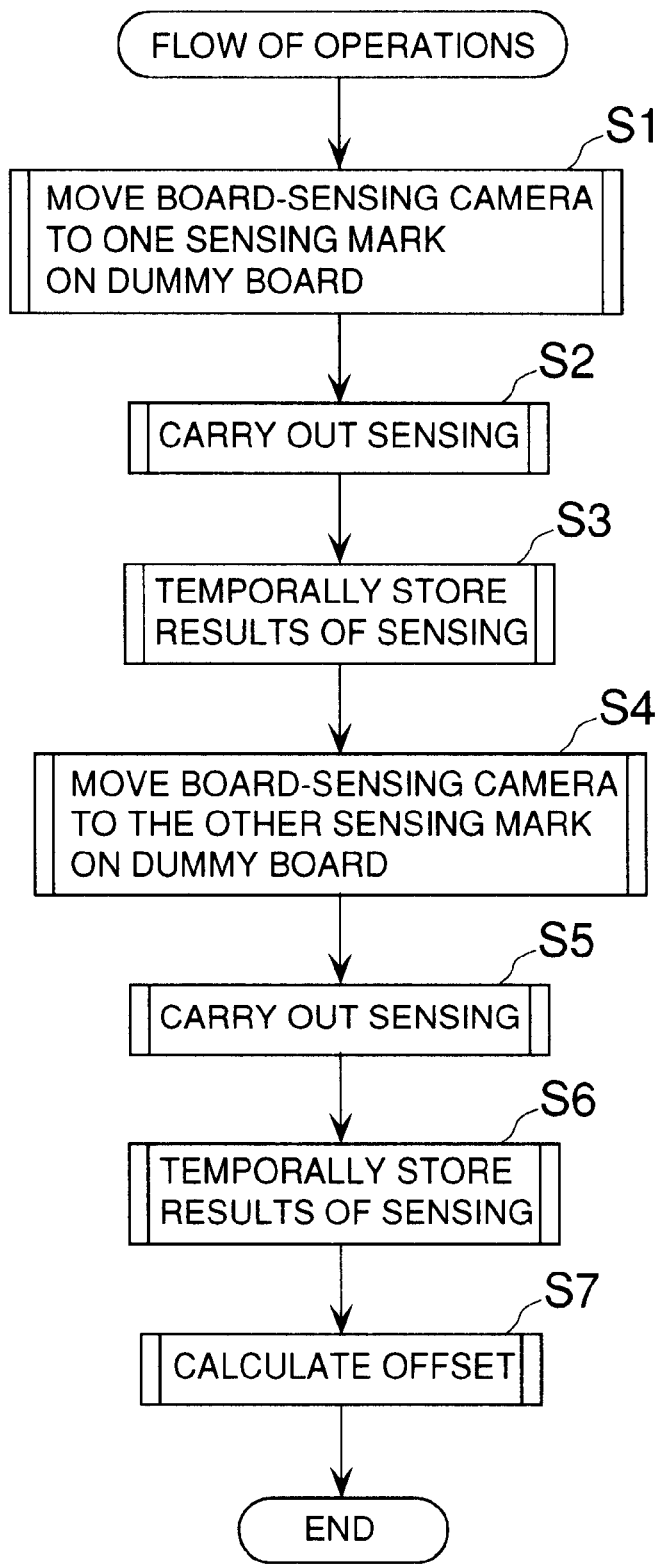
FIG. 6 is a flowchart showing a flow of operations for obtaining offset data used for compensating for the motion angle deviation of the X-Y stage.

More specifically, the dummy board 50 is positioned in the circuit board-positioning X-Y coordinates, and the offset data are obtained following a flow of operations shown in FIG. 6. As shown in the figure, first, at a step S1, the board-sensing camera 11 is moved according to design values of coordinates such that the sensing center (center of the field of view) of the camera 11 agrees with a position of one (right-side one) of the recognition marks 52. Then, an image of the recognition mark 52 is taken by the camera 11, and recognition of the image is carried out at a step S2. At the following step S3, results of the recognition (i.e. position coordinates of a center of the mark viewed from the sensing center of the camera, i.e. the center of the field of view, in the scanning coordinate system of the camera 11 obtained by the recognition) are temporarily stored in the memory 110 as [dx1, dy1].

Then, at a step S4, the board-sensing camera 11 is moved according to design values such that the center (center of the field of view) of the camera 11 agrees with a position of the other recognition mark (right-side one) 52. After the camera 11 is moved to the position, an image of the recognition mark 52 is taken by the camera 11, and recognition of the image is carried out at a step S5. Results of the recognition (i.e. position coordinates of a center of the mark viewed from the sensing center of the camera in the scanning coordinate system of the camera 11 obtained by the recognition) are temporarily stored in the memory 110 as [dx2, dy2] at a step S6.

At the following step S7, the offset data (offset amounts) are calculated by the use of equations set forth hereinbelow.

(1) Offset amounts of the Y-direction movable beam, i.e. the amount of offset in the X-direction (left-right direction) and the amount of offset in the Y-direction (front-rear direction), are calculated by the use of the following equations, respectively:

$$dx1' = dx1 * \text{COS}(-(CAMA3)) - dy1 * \text{SIN}(-(CAMA3))$$

$$dy1' = dy1 * \text{COS}(-(CAMA3)) + dy1 * \text{SIN}(-(CAMA3))$$

wherein—(CAMA3) represents angle offset of the board-sensing camera.

(2) An angle offset amount of the Y-direction movable beam is calculated by the following equation:

$$dz = \tan^{-1}\{P^* (dy1'-dy2')/P^*(P+(dx1'-dx2'))\}$$

where P represents an X-direction pitch between the two recognition marks (Y-direction pitch is zero).

The offset amounts (1), (2) obtained as above are stored in the memory 110 as offset data, and design values of coordinates are corrected based on the offset data.

Next, description will be made of correction of the coordinate system of (i.e. peculiar to) the component-sensing camera 13 with respect to the coordinate system of (i.e. peculiar to) the board-sensing camera 11. First, the dummy component 40 is picked up from the dummy component-storing device 31, and then the Y-direction movable beam 22 is moved to a design position of the component-sensing camera 13 in the PL-XY coordinate system, while taking the offset amounts of the Y-direction movable beam 22 (beam offset amounts) [X-direction offset, Y-direction offset, angle offset] into account, for sensing of the dummy component 40. Results of the sensing or recognition are stored as [Prec__1x, Prec__1y, Prec__1z]. Then, the Y-direction movable beam 22 is moved by taking the beam offset amounts into account to a design position (no offset) of the image-taking table (backlight plate) 32 with the dummy component 40 held in an attitude-fixed state, and the dummy component 40 is placed on the image-taking table 32. Subsequently, the board-sensing camera 11 is moved (by taking the beam offset amounts into account) along the Y-direction movable beam 22 to the design position of the image-taking table 32 for sensing the dummy component 40. Results of the sensing or recognition are stored as [Prec__2x, Prec__2y, Prec__2z].

Figure 7:
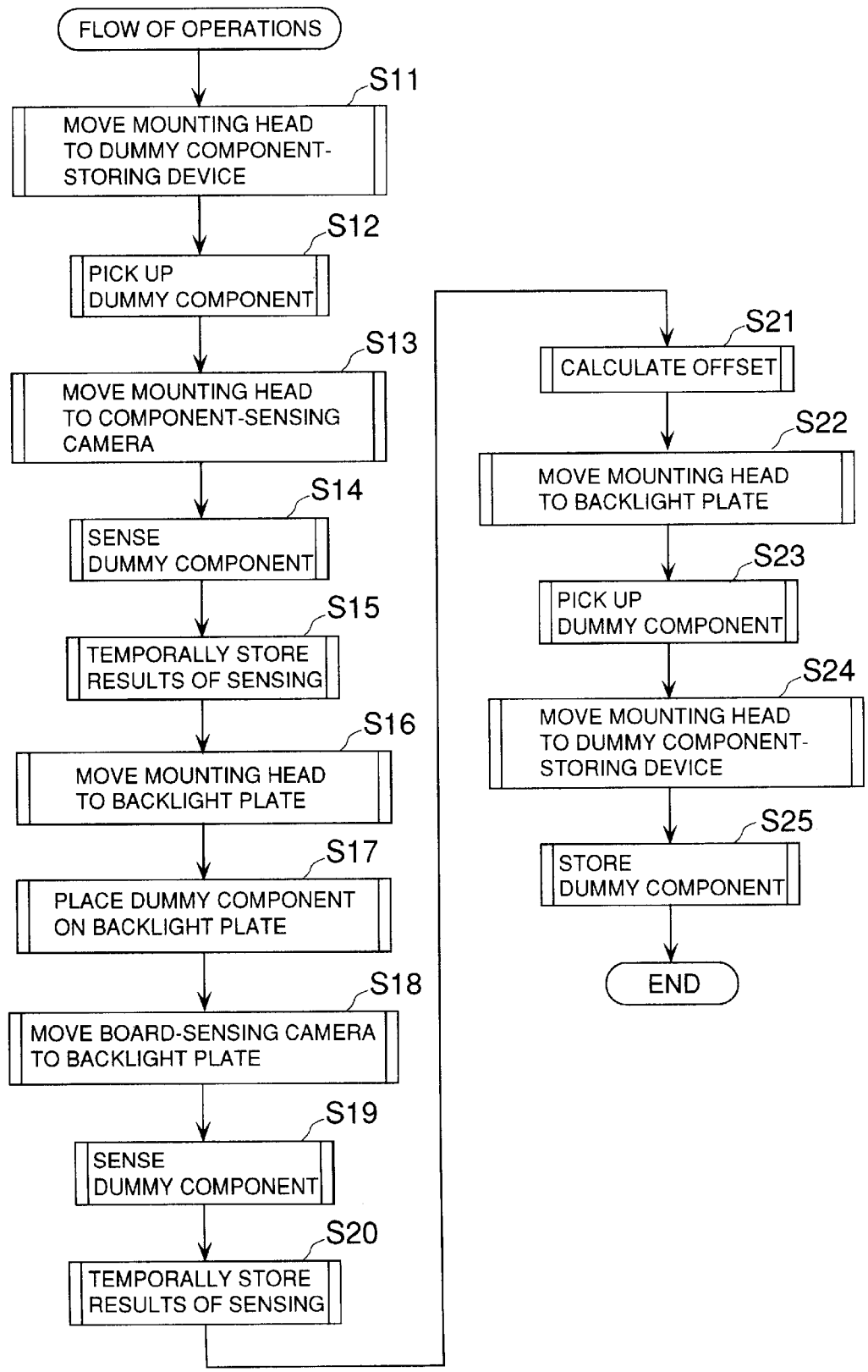
FIG. 7 is a flowchart showing a flow of operations for obtaining offset data used for correcting a coordinate system of a component-sensing camera with respect to a coordinate system of the board-sensing camera, by taking the motion angle deviation of the X-Y stage into account.

More specifically, the offset data are obtained, following a flow of operations shown in FIG. 7. The following are data items (all of which are values in the board-positioning X-Y coordinate system) used for description of the FIG. 7 flow:

Bmoff__x: beam offset X; Bmoff__y: beam offset Y; Bmoff__z: beam offset angle

STK__X: design position X of the dummy component-storing device; STK__Y: design position Y of the dummy component-storing device CAM__X: design position X of the component-sensing camera; CAM__Y: design position Y of the component-sensing camera BLT__X: design position X of the backlight plate; BLT__Y: design position Y of the backlight plate BM__X: design position X of the beam origin; BM__Y: design position Y of the beam origin HD__X: design position X of the mounting head with respect to beam pivot A0; HD__Y: design position Y of the mounting head with respect to beam pivot A0.

As shown in FIG. 7, first at a step S11, the mounting head 12 is brought by the Y-direction movable beam 22 to the dummy component-storing device 31 and the dummy component 40 is picked up from the dummy component-storing device 31 at a step S12. In this case, target values (X, Y) of distance of motion of the Y-direction movable beam 22 are calculated by using the following equations:

$$X = (STK\_X - (BM\_X + HD\_X + Bmoff\_x)) * COS(Bmoff\_z) -$$
$$(STK\_Y - (BM\_Y + HD\_Y + Bmoff\_y)) * SIN(Bmoff\_z)$$
$$Y = (STK\_Y - (BM\_Y + HD\_Y + Bmoff\_y)) * COS(Bmoff\_z) -$$
$$(STK\_X - (BM\_X + HD\_X + Bmoff\_x)) * SIN(Bmoff\_z)$$

Then, at a step S13, the dummy component 40 is moved from the location where it is picked up from the dummy component-storing device 31 to a location opposed to the component-sensing camera 13, and sensed by the camera 13 at a step S 14. In this case, target values (X, Y) of distance of motion of the Y-direction movable beam 22 are calculated by using the following equations:

$$X = (CAM\_X - (BM\_X + HD\_X + Bmoff\_x)) * COS(Bmoff\_z) -$$
$$(CAM\_Y - (BM\_Y + HD\_Y + Bmoff\_y)) * SIN(Bmoff\_z)$$
$$Y = (CAM\_Y - (BM\_Y + HD\_Y + Bmoff\_y)) * COS(Bmoff\_z) -$$
$$(CAM\_X - (BM\_X + HD\_X + Bmoff\_x)) * SIN(Bmoff\_z)$$

Results of the sensing (coordinates of the center of the component viewed from the sensing center of the component-sensing camera 13 as the origin of the scanning coordinate system thereof) are temporarily stored as [Prec__1x, Prec__1y, Prec__1z] at a step S15.

The mounting head 12 having the dummy component 40 picked thereat is brought to the image-taking table (backlight plate) 32 at a step S16, and the dummy component 40 is placed on the table 32 at a step S17. In this case, target values (X, Y) of distance of motion of the Y-direction movable beam 22 are calculated by using the follow equations:

$$X = (BLT\_X - (BM\_X + HD\_X + Bmoff\_x)) * COS(Bmoff\_z) -$$
$$(BLT\_Y - (BM\_Y + HD\_Y + Bmoff\_y)) * SIN(Bmoff\_z)$$
$$Y = (BLT\_Y - (BM\_Y + HD\_Y + Bmoff\_y)) * COS(Bmoff\_z) -$$
$$(BLT\_X - (BM\_X + HD\_X + Bmoff\_x)) * SIN(Bmoff\_z)$$

Then, the board-sensing camera 11 is brought to the image-taking table 32 at a step S18, and the dummy component 40 is sensed by the board-sensing camera 11 at a step S19. Before this sensing operation, the backlight 34 is turned on to illuminate the dummy component 40. In this case, target values (X, Y) of distance of motion of the Y-direction movable beam 22 are calculated by using the following equations:

$$X = (BLT\_X - (BM\_X + Bmoff\_x)) * COS(Bmoff\_z) - (BLT\_Y -$$
$$(BM\_Y + Bmoff\_y)) * SIN(Bmoff\_z)$$
$$Y = (BLT\_Y - (BM\_Y + Bmoff\_y)) * COS(Bmoff\_z) - (BLT\_X -$$
$$(BM\_X + Bmoff\_x)) * SIN(Bmoff\_z)$$

Results of the sensing (coordinates of the center of the component viewed from the sensing center of the board-sensing camera 11 as the origin of the scanning coordinate system thereof) are temporarily stored as [Prec__2x, Prec__2y, Prec__2z] at a step S20.

Then, at a step S21, the offset data (offset amounts) are calculated by the use of equations set forth hereinbelow.

(1) An X coordinate (in the left-right direction), a Y coordinate (in the front-rear direction), and an angle of the component-sensing camera are calculated by the use of the following equations:

$$Rcnv\_1x = Prec\_1x * COS(-\Theta') - Prec\_1y * SIN(-\Theta')$$
$$Rcnv\_1y = Prec\_1y * COS(-\Theta') + Prec\_1x * SIN(-\Theta')$$
$$Rcnv\_2x = Prec\_2x * COS(-CAMA3 Z) - Prec\_2y *$$
$$SIN(-CAMA3 Z)$$
$$Rcnv\_2y = Prec\_2y * COS(-CAMA3 Z) + Prec\_2x *$$
$$SIN(-CAMA3 Z)$$

where $\Theta''$=Prec__2z−Prec__1z+CAMA3 Z(angle), which represents an offset amount of the board-sensing camera.

(2) Offset amounts of the component-sensing camera, i.e. the amount of offset in the X-direction (left-right direction), the amount of offset in the Y-direction (front-rear direction), and the amount of offset in angle are calculated by using the following respective equations:

$$Cmoff\_x = Rcnv\_2x - Rcnv\_1x$$
$$Cmoff\_y = Rcnv\_2y - Rcnv\_1y$$
$$Cmoff\_z = \Theta' = Rcnv\_2z - Rcnv\_1z + CAMA3 Z(angle)$$

The offset amounts thus obtained are stored in the memory 110 as offset data, and design values of coordinates are corrected based on the offset data.

After the offset data are obtained, the mounting head is brought to the image-taking table 32 at a step S22, and the dummy component 40 is picked up at a step S23. At the following step S24, the mounting head 12 is brought from the image-taking table 32 to the dummy component-storing device 31, and at a step S25, the dummy component is received in the device 31. Thus, the dummy component 40 is returned to its original position, whereby the sequence of operations for the correction is completed.

As described above, according to the embodiment of the invention, a displacement of the coordinate system of the board-sensing camera 11 from the absolute reference coordinate system and a deviation in the angle of the X-Y stages 6a, 6b (i.e. locus of the sensing center of the board-sensing camera 11) are compensated through position recognitions carried out by using the dummy board 50, and then the coordinate system of the component-sensing camera 13 with respect to the coordinate system of the board-sensing camera 11 is corrected. This makes it possible to carry out extremely accurate compensation for a displacement between the coordinate systems of the two cameras 11, 13 and that between each of the coordinate systems of the two cameras 11, 13 and the absolute reference coordinate system.

Particularly, the displacement between the coordinate systems of the cameras 11, 13 can be compensated for with ease and rapidity because it is possible to detect the displacement through sensing of the dummy component 40 by the cameras 11, 13. Further, since the dummy component is dedicatedly used for correction of camera positions is illuminated during the taking of an image thereof, the dummy component 40 can be sensed without an error, which enables the overall operation for correction to be carried out accurately. This ensures highly precise and stable mounting of electronic components on circuit boards.

It is further understood by those skilled in the art that the foregoing is a preferred embodiment of the invention, and that various changes and modifications may be made without departing from the spirit and scope thereof.

What is claimed is:

1. A method of correcting a camera position by compensating for a displacement between a first coordinate system peculiar to a board-sensing camera for sensing a position of a circuit board, and a second coordinate system peculiar to a component-sensing camera for sensing a position of an electronic component to be mounted on said circuit board, the method comprising the steps of:

causing said board-sensing camera to take an image of a dummy component in an attitude-fixed state in said first coordinate system;

causing said component-sensing camera to take an image of said dummy component in an attitude-fixed state in said second coordinate system;

calculating an amount of deviation of a center of said dummy component from a sensing center of said board-sensing camera and an amount of deviation of said center of said dummy component from a sensing center of said component-sensing camera, from a result of the taking of said image of said dummy component by said board-sensing camera and a result of the taking of said image of said dummy component by said component-sensing camera; and correcting at least one of said first coordinate system and said second coordinate system based on the calculated amounts of deviation of said center of said dummy component.

2. A camera position-correcting system, comprising:

a dummy component;

a board-sensing camera normally used for taking an image of a circuit board, said board-sensing camera having a first coordinate system peculiar thereto;

a component-sensing camera normally used for taking an image of an electronic component to be mounted on said circuit board, said component-sensing camera having a second coordinate system peculiar thereto;

image-taking operation control means for causing said board-sensing camera to take an image of said dummy component in an attitude-fixed state in said first coordinate system and said component-sensing camera to take an image of said dummy component in an attitude-fixed state in said second coordinate system;

deviation-calculating means for calculating an amount of deviation of a center of said dummy component from a sensing center of said board-sensing camera and an amount of deviation of said center of said dummy component from a sensing center of said component-sensing camera, from a result of the taking of said image of said dummy component by said board-sensing camera and a result of the taking of said image of said dummy component by said component-sensing camera; and correction means for correcting at least one of said first coordinate system and said second coordinate system based on the calculated amounts of deviation of said center of said dummy component to thereby compensate for a displacement between said first coordinate system and said second coordinate system.

3. A camera position-correcting system according to claim 2, wherein said first coordinate system and said second coordinate system each include an angle of rotation on a horizontal plane.

4. A camera position-correcting system according to claim 2, including a body, and wherein said component-sensing camera is fixedly arranged in said body based on an absolute reference coordinate system peculiar to said body, and said board-sensing camera is movably arranged in said body based on said absolute reference coordinate system, the camera position-correcting system further comprising:

a dummy board for being positioned on said body based on said absolute reference coordinate system; and absolute correction means for compensating for a displacement between said first coordinate system and said absolute reference coordinate system, via said dummy board placed on said body, prior to compensating for said displacement between said first coordinate system and said second coordinate system.

5. A camera position-correcting system according to claim 4, wherein said first coordinate system, said second coordinate system and said absolute reference coordinate system each include an angle of rotation on a horizontal plane.

6. A camera position-correcting system according to claim 4 or 5, further including X-Y motion means for moving said board-sending camera in an X-Y direction, and wherein said absolute correction means compensates for said displacement between said first coordinate system and said absolute reference coordinate system, and at a same time compensates for an angular displacement of a moving coordinate system peculiar to said X-Y motion means with respect to said absolute reference coordinate system, via said dummy board placed on said body.

7. A camera position-correcting system according to claim 4 or 5, including a mounting head for mounting said electronic component on said circuit board, and a support member movably mounted on said body, said board-sensing camera, said mounting head, and said support member forming a unit for motion in unison;

said mounting head being fixed to said support member based on said absolute reference coordinate system.

8. A camera position-correcting system according to claim 2, wherein said dummy component comprises a transparent base and an imaging pattern depicted on said base.

9. A camera position-correcting system according to claim 2, including a dummy component-storing device for storing said dummy component therein, and an image-taking table for placing said dummy component thereon to permit said board-sensing camera to take the image of said dummy component, and wherein said image-taking table has a table on which said dummy component is placed, and a backlight for irradiating said dummy component through said table.

10. A camera position-correcting system according to claim 9 wherein said dummy component comprises:

a transparent base and an imaging pattern depicted on said transparent base.

11. A dummy component according to claim 10 wherein said imaging pattern comprises a plurality of large and small patterns each having an identical center and permitting the sensing of said amount of deviation.

12. A camera position-correcting system according to claim 2 wherein said dummy component is used for enabling an amount of deviation of a center thereof from a sensing center of a sensing-camera to be sensed through taking an image of said dummy component, with said dummy component comprising:

a transparent base; and an imaging pattern depicted on said transparent base.

13. A dummy component according to claim 12 wherein said imaging pattern comprises a plurality of large and small patterns each having an identical center and permitting the sensing of said amount of deviation.

* * * * *